US011739757B2

(12) United States Patent
Müllner

(10) Patent No.: US 11,739,757 B2
(45) Date of Patent: Aug. 29, 2023

(54) CIRCULAR MAGNETIC FIELD GENERATOR AND PUMP WITH ROTATING PERMANENT MAGNET

(71) Applicant: BOISE STATE UNIVERSITY, Boise, ID (US)

(72) Inventor: Peter Müllner, Boise, ID (US)

(73) Assignee: Boise State University, Boise, ID (US)

(*) Notice: Subject to any disclaimer, the term of this patent is extended or adjusted under 35 U.S.C. 154(b) by 656 days.

(21) Appl. No.: 16/939,401

(22) Filed: Jul. 27, 2020

(65) Prior Publication Data
US 2022/0025888 A1    Jan. 27, 2022

(51) Int. Cl.
| G11C 11/14 | (2006.01) |
| F04D 13/06 | (2006.01) |
| G11C 11/16 | (2006.01) |
| F04B 43/04 | (2006.01) |
| H01F 1/03 | (2006.01) |
| F04B 19/00 | (2006.01) |
| H10N 35/00 | (2023.01) |

(52) U.S. Cl.
CPC ............ *F04D 13/06* (2013.01); *F04B 19/006* (2013.01); *F04B 43/043* (2013.01); *G11C 11/161* (2013.01); *H01F 1/0308* (2013.01); *H10N 35/00* (2023.02); *F05C 2251/08* (2013.01); *F05C 2251/12* (2013.01)

(58) Field of Classification Search
CPC ...... G11C 11/161; H01F 1/0308; H10N 35/00; F04B 19/006; F04B 43/043
USPC ........................................................ 365/171
See application file for complete search history.

(56) References Cited

U.S. PATENT DOCUMENTS 7,280,016 B2 * 10/2007 Taya ..................... B64C 21/02
335/78
2021/0082604 A1 * 3/2021 Müllner ............... H01F 1/0308

* cited by examiner

*Primary Examiner* — Vu A Le
(74) *Attorney, Agent, or Firm* — Parsons Behle & Latimer

(57) ABSTRACT

A system may include a magnetic shape memory (MSM) element having a longitudinal axis that extends from a first end of the MSM element to a second end of the MSM element. The system may further include a rotatable permanent magnet configured to rotate around an axis of rotation and positioned proximate to the MSM element. The system may also include a first solenoid having a first solenoid axis directed at the rotatable permanent magnet. The system may include a second solenoid having a second solenoid axis directed at the rotatable permanent magnet. A method may include applying a first alternating current (AC) signal to the first solenoid and a second AC signal to the second solenoid to cause the rotatable permanent magnet to rotate.

20 Claims, 6 Drawing Sheets

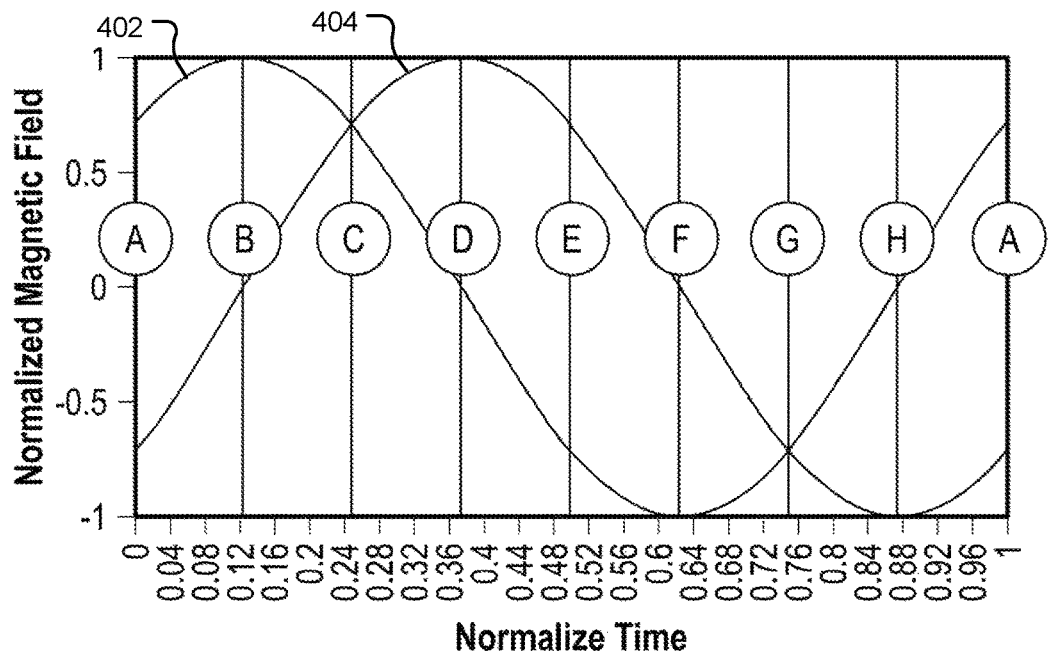
FIG. 4
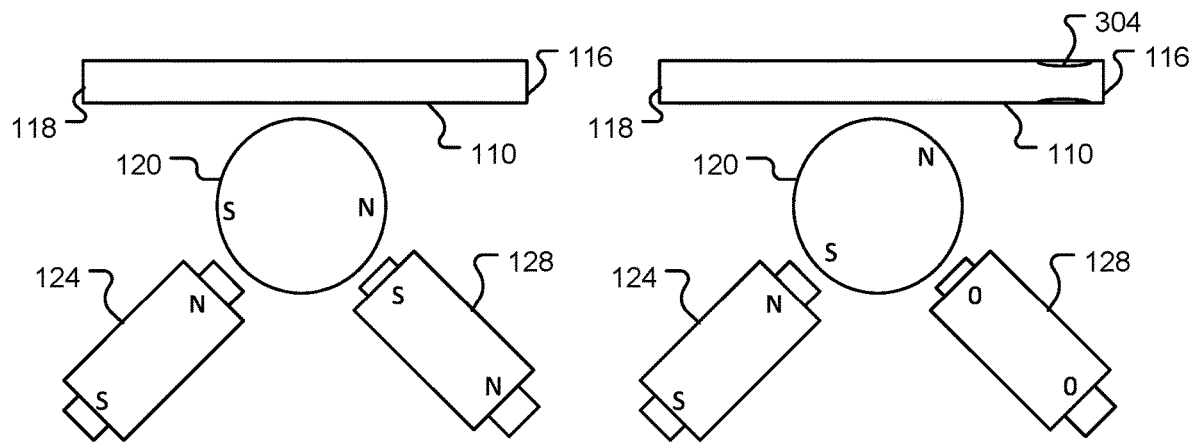
FIG. 5A                    FIG. 5B

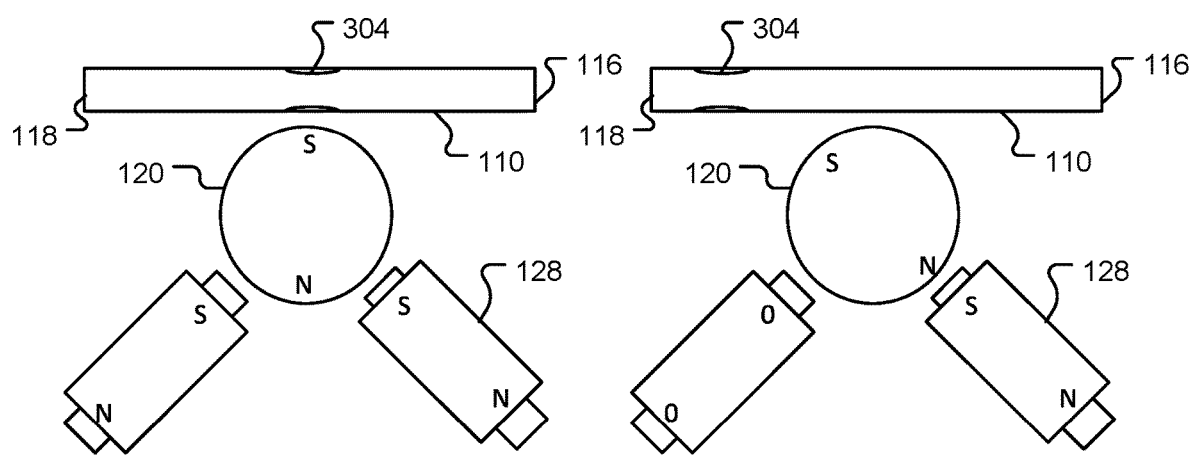

CIRCULAR MAGNETIC FIELD GENERATOR AND PUMP WITH ROTATING PERMANENT MAGNET

FIELD OF THE DISCLOSURE

This disclosure is generally related to the field of electromagnetic actuation, and, in particular, to circular magnetic field generation with a rotating permanent magnet for magnetic shape memory (MSM) based actuation.

BACKGROUND

MSM alloys (MSMAs) may deform strongly when subjected to a variable magnetic field. This deformation may be useful for micro-actuation purposes. For example, MSMAs may be used in micropumps where it is desirable to transmit small volumes (e.g., sub-microliter volumes) of fluid from one location to another, such as delivering small doses of drugs to a subject over a period of time. An MSM micropump may operate by local variations of the magnetic field, thereby reducing a volume of the pump and increasing the energy efficiency of the pump. In other examples, MSM elements may be used for actuating valves, manifolds, or other devices.

Some MSM actuation devices may generate local variations in the magnetic field using a rotating permanent magnet. However, the rotating permanent magnet is typically attached to an external motor via a shaft which must be powered externally and may result in the loss of energy from multiple electrical-mechanical conversions. Further, the additional motor components may be too large in some applications. The additional components may also be associated with additional costs.

In some cases, in order to reduce the size and weight of an MSM actuation device, instead of using a permanent magnet for actuation, a set of electromagnetic coils may generate a variable magnetic field. The arrangement of the coils may be simple, such as a linear arrangement. The local magnetic field may be varied by changing the polarity of individual coils. In some cases, the coils may be arranged at angles to generate phase-driven magnetic field rotation. The local magnetic field at an MSM element may be varied by rotating a magnetic field generated by the coils. However, these examples of coil driven devices may need electrical currents that are too high for some applications. If high electrical currents are not provided to the coils, the resulting magnetic field may not be strong enough to result in sufficient deformation of the MSM element. Other disadvantages may exist.

SUMMARY

In an embodiment, a system may include an MSM element having a longitudinal axis that extends from a first end of the MSM element to a second end of the MSM element. The system may further include a rotatable permanent magnet configured to rotate around an axis of rotation and positioned proximate to the MSM element. The system may also include a first solenoid having a first solenoid axis directed at the rotatable permanent magnet. The system may include a second solenoid having a second solenoid axis directed at the rotatable permanent magnet.

In some embodiments, the system includes a pump housing having an inlet and an outlet formed within an inner surface of the pump housing, where the MSM element is positioned adjacent to the inner surface of the pump housing and extends from the inlet to the outlet. In some embodiments, a rotating magnetic field produced by the rotatable permanent magnet causes a contracted portion of an MSM element to move from near the first end of the MSM element towards the second end of the MSM element. In some embodiments, magnetic fields produced by the first solenoid and the second solenoid cause the rotatable permanent magnet to rotate. In some embodiments, the first solenoid axis and the second solenoid axis intersect at an angle of 90°. In some embodiments, the system includes a controller configured to apply a first alternating current (AC) signal to the first solenoid and a second AC signal to the second solenoid, wherein the first AC signal and the second AC signal have a 90° phase difference. In some embodiments, the controller is configured to shift a phase of the first AC signal by 90° to form the second AC signal. In some embodiments, the system includes one fixed magnet positioned at one end of the MSM element. In some embodiments, the system includes a first fixed magnet positioned at the first end of the MSM element and a second fixed magnet positioned at the second end of the MSM element. In some embodiments, the system includes a magnetic yoke configured to at least partially direct a magnetic field along a magnetic circuit path from the MSM element to the rotating permanent magnet. In some embodiments, the system includes a first magnetic core positioned within the first solenoid and a second magnetic core positioned within the second solenoid. In some embodiments, the system includes one or more additional solenoids having one or more respective solenoid axes directed at the rotatable permanent magnet. In some embodiments, the rotatable permanent magnet is diametrically magnetized.

In an embodiment, a method includes applying a first alternating current (AC) signal to a first solenoid. The method further includes applying a second AC signal to a second solenoid, where a first phase of the first AC signal is offset from a second phase of the second AC signal. The method also includes, in response to magnetic fields produced by the first solenoid and the second solenoid, rotating a rotatable permanent magnet. The method includes, in response to a rotating magnetic field produced by the rotatable permanent magnet, moving a contracted portion of an MSM element from a first end of the MSM element to a second end of the MSM element.

In some embodiments, the MSM element is positioned adjacent to an inner surface of a pump housing and extends from an inlet formed within the inner surface of the pump housing to an outlet formed within the inner surface of the pump housing. In some embodiments, the method includes moving a fluid from the inlet to the outlet using the contracted portion of the MSM element. In some embodiments, the first solenoid has a first solenoid axis and the second solenoid has a second solenoid axis, and the first solenoid axis and the second solenoid axis intersect at an angle of 90°. In some embodiments, the first AC signal and the second AC signal have a 90° phase difference. In some embodiments, the method includes shifting a phase of the first AC signal by 90° to form the second AC signal. In some embodiments, the method includes applying one or more additional AC signals to one or more additional solenoids. In some embodiments, the method includes using a magnetic yoke to direct a magnetic field along a magnetic circuit path from the MSM element to the rotating permanent magnet.

BRIEF DESCRIPTION OF THE DRAWINGS

FIG. 4 is a graph depicting a first normalized magnetic field at a first solenoid and a second normalized magnetic field at a second solenoid.

FIGS. 5A-5H are schematic diagrams depicting a rotation of a combined magnetic flux at various times associated with the first and second normalized magnetic fields of FIG. 4.

Figure 1:
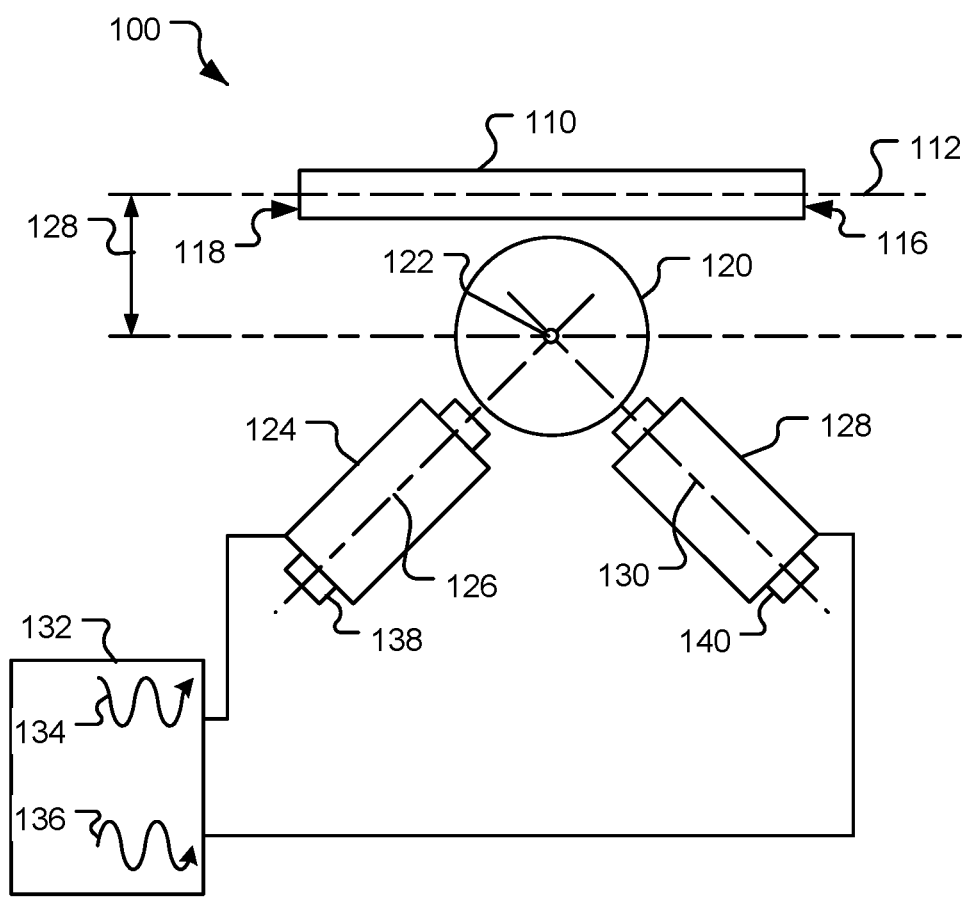
FIG. 1 is a schematic diagram depicting an embodiment of an MSM actuation system.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Examples of micro-actuation using an MSM element and examples of micropumps that operate by local variations in a magnetic field are described in U.S. Pat. No. 9,091,251, filed on Jul. 16, 2012 and entitled "Actuation Method and Apparatus, Micropump, and PCR Enhancement Method," U.S. Pat. No. 10,408,215, filed on Sep. 23, 2014 and entitled "Electrically Driven Magnetic Shape Memory Apparatus and Method," U.S. Pat. No. 10,535,457, filed on Mar. 31, 2016 entitled "Electrically Driven Magnetic Shape Memory Apparatus and Method," and U.S. patent application Ser. No. 16/545,632, filed on Aug. 20, 2019, published as U.S. Patent App. Publication No. 2020/0066965, and entitled "Circular Magnetic Field Generator and Pump," the contents of each of which are hereby incorporated by reference herein in their entirety. Some traits and properties of the MSM materials and elements described herein may correspond to and be substantially similar to the traits and properties of MSM materials and elements described in the above applications as would be appreciated by persons of skill in the art having the benefit of this disclosure. Likewise, specific traits and properties relating embodiments of a micropump described herein may correspond to and be substantially similar to some traits and properties of micropumps described in the above applications as would be appreciated by persons of skill in the art having the benefit of this disclosure.

Referring to FIG. 1, an embodiment of an MSM actuation system 100 is depicted. The system 100 may include an MSM element 110, which may be an elongated bar or wire of MSM material having a first end 116 and a second end 118. A longitudinal axis 112 may run along the length of the MSM element 110 from the first end 116 to the second end 118.

The system 100 may include a rotatable permanent magnet 120 configured to rotate around an axis of rotation 122. In FIG. 1, the axis of rotation 122 is depicted as a dot, which may be interpreted as a line passing into and out of FIG. 1 from the perspective of a viewer. The rotatable permanent magnet 120 may be proximate to the MSM element 110. As used herein, the term proximate means that a distance 128 between the axis of rotation 122 and the longitudinal axis 112 of the MSM element 110 is such that a magnetic field produced by the rotatable permanent magnet 120 is sufficiently strong at the MSM element 110 to leverage a twinning property of the MSM element 110, thereby resulting in a localized compressed or contracted portion (or neck or shrinkage) at the MSM element 110 as described further herein. The rotatable permanent magnet 120 may be diametrically magnetized for consistency in the change of magnetization as the rotatable permanent magnet 120 rotates.

The system 100 may include a first solenoid 124 and a second solenoid 128. The first solenoid 124 may have a first solenoid axis 126 and the second solenoid 128 may have a second solenoid axis 130. Both of the solenoids 124, 128 may optionally have respective cores 138, 140, which may be made of iron, other magnetic materials, or other types of solenoid core material.

The solenoid axis 126 and the solenoid axis 130 may be directed at the rotatable permanent magnet 120. An angle between the solenoid axes 126, 130 may enable the solenoids 124, 128 to produce a rotating magnetic flux when AC signals 134, 136 having different phases are simultaneously applied to the solenoids 124, 128. The exact shape and consistency of the rotating magnetic flux may depend on the position of the solenoids 124, 128 and on the specific waveforms of the AC signals 134, 136. In an example, the angle between the solenoid axes 126, 130 may be 90°.

The system 100 may include a controller 132 configured to apply a first AC signal 134 to the first solenoid 124 and a second AC signal 136 to the second solenoid 128. The AC signals 134, 136 may produce a rotating magnetic flux that causes the rotatable permanent magnet 120 to rotate around the axis of rotation 122. The permanent magnet 120 may, in turn, produce a rotating magnetic field that causes a localized neck to form in the MSM element 110 and to move from either the first end 116 of the MSM element 110 to the second end 118 or from the second end 118 to the first end 116 depending on a direction of rotation. In order to produce this effect, the first AC signal 134 and the second AC signal 136 may have a same amplitude and a same frequency, while having a substantially 90° phase difference.

The controller 132 may include any type of circuitry or processing elements to produce the AC signals 134, 136. Types of circuitry may include switches, amplifiers, modulators, demodulators, and the like. Types of processing elements may include a central processing unit (CPU), a digital signal processor (DSP), a peripheral interface controller (PIC), and/or another type of processing element. In an embodiment, the controller 132 may receive the first AC signal 134 and may generate the second AC signal 136 by phase shifting the first AC signal 136. Then, both signals may be sent to their respective solenoids 124, 128.

Figure 2:
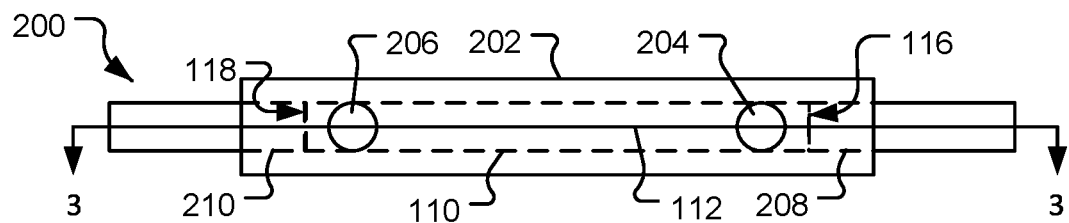
FIG. 2 is a top view of a schematic diagram depicting an embodiment of an MSM micropump system.
Figure 3:
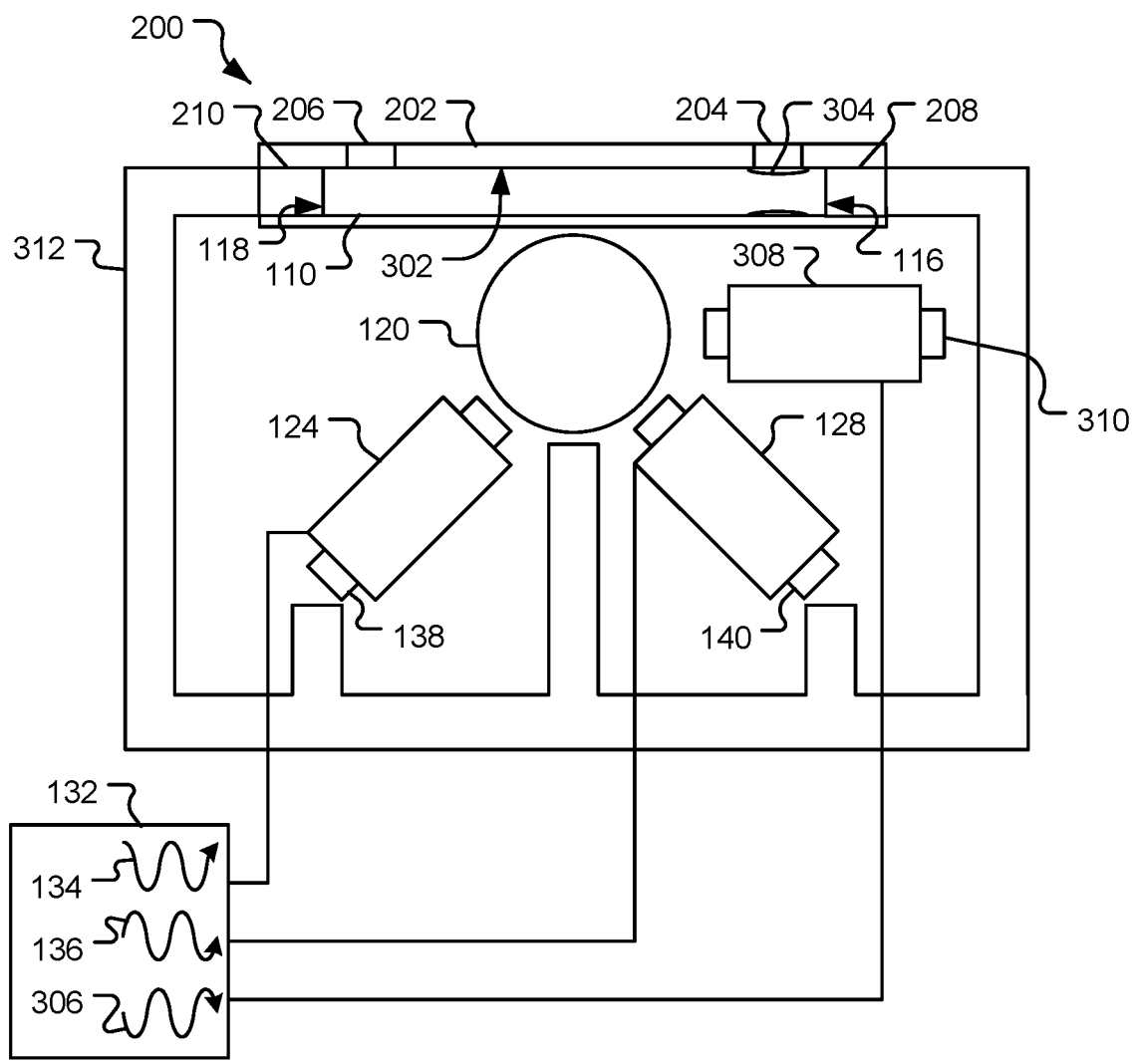
FIG. 3 is a side view of a schematic diagram depicting an embodiment of an MSM micropump system with a pump housing and MSM element shown in cross-section.

Referring to FIG. 2, an embodiment of an MSM micropump system 200 is depicted. FIG. 2 is a top view of the system 200. For clarity, FIG. 2 omits some additional elements of the system 200, such as the rotatable permanent magnet 120, the solenoids 124, 128, the controller 132, one or more optional additional solenoids 308, and an optional magnetic yoke 312, which are depicted in FIG. 3. As shown in FIG. 2, the system 200 may include a pump housing 202 with a first port 204 and a second port 206 defined therein. The ports 204, 206 may be openings within the pump housing 202 used for fluid inlets and/or outlets. The MSM element 110 may be positioned within the pump housing 202 with the first end 116 of the MSM element 110 being associated with the first port 204 the second end 118 of the MSM element 110 being associated with the second port 206.

The system 200 may also include a first fixed magnet 208 and a second fixed magnet 210. The fixed magnets 208, 210 may be included to linearly enhance a magnetic field through the MSM element, which may help localize a contracted portion of the MSM element 110. The optional fixed magnets 208, 210 may be permanent magnets or electromagnets, depending on a particular application. In some applications, the fixed magnets 208, 210 may be omitted.

Referring to FIG. 3, the MSM micropump system 200 is depicted in a side view with the pump housing 202 and MSM element 110 shown in cross-section. In the system 200, the MSM element 110 may be flush with and in contact with an inner surface 302 of the pump housing 202, thereby blocking fluid flow between the ports 204, 206.

The system 200 may further include one or more optional additional solenoids 308 having a respective optional solenoid core 310. Although one additional solenoid 308 is depicted, more than one may be used in practice. Further, although the additional solenoid 308 is depicted as horizontal relative to the MSM element 110, it may be positioned at any angle and may be located at other positions relative to the rotatable permanent magnet 120. For example, the additional solenoid 308 (and possibly another additional solenoid, not shown) may be positioned opposite the first solenoid 124 and the second solenoid 128 on the other side of the MSM element 110. This may help to enhance the magnetic field that causes the rotatable permanent magnet 120 to rotate. Other configurations of the solenoids 124, 128 and the additional solenoid 308 are possible.

An optional magnetic yoke 312 may be positioned near both ends 116, 118 of the MSM element 110 and may contact the fixed magnets 208, 210 (or the MSM element 110 in embodiments that omit the fixed magnets 208, 210). The magnetic yoke 312 may circle to the other side of the rotatable permanent magnet 120 to guide a magnetic field from the MSM element 110 back to the rotatable permanent magnet 120 to close a magnetic circuit. The shape of the magnetic yoke 312 may vary depending on application. In some cases, the magnetic yoke may direct the magnetic field to the respective solenoid cores 138, 140. In some cases, the magnetic yoke 312 may direct the magnetic field directly to the rotatable permanent magnet 120. In some cases, as depicted in FIG. 3, the magnetic yoke 312 may direct the magnetic field to both the rotatable permanent magnet 120 and the solenoid cores 138, 140.

During operation, the controller 132 may send the first AC signal 134 to the first solenoid 124 and the second AC signal 136 to the second solenoid 128. In response to the AC signals 134, 136, the solenoids 124, 128 may produce a rotating magnetic flux that. In response to the rotating magnetic flux, the rotatable permanent magnet 120 may begin to rotate. A magnetic field produced by the rotatable permanent magnet 120 may be predominantly perpendicular to the MSM element 110 near the first port 204. A contraction or neck 304 may form in the MSM element 110 at that location. Fluid may be admitted into a cavity formed by the neck 304 between the MSM element 110 and the surface 302 of the pump housing 202. As the rotatable permanent magnet 120 rotates, the predominant direction of the rotating magnetic field may move along the MSM element 110 from the first end 116 to the second end 118 or from the second end 118 to the first end 116 depending on the direction of rotation. Thus, fluid may be transported between the ports 204, 206. In applications that include the one or more additional solenoids 308, an additional AC signal 306 may be provided to the additional solenoid(s) 308 in order to assist with rotating the rotatable permanent magnet 120.

A benefit of the systems 100, 200 is that by including the rotatable permanent magnet 120, a rotating magnetic field may be generated that can actuate the MSM element 110 without large amounts of electrical current being used to generate the field. By using the solenoids 124, 128 to rotate the rotatable permanent magnet 120, an external motor and shaft may be omitted. Other benefits may exist.

FIGS. 4 and 5A-5H demonstrate a full rotation of the rotatable permanent magnet 120. FIG. 4 depicts a first normalized magnetic field 402 at the first solenoid 124 and a second normalized magnetic field 404 at the second solenoid 128. The first normalized magnetic field 402 may be generated by the first AC signal 134 and the second normalized magnetic field 404 may be generated by the second AC signal 136. As shown in FIG. 4, the normalized magnetic fields 402, 404 may have a phase difference of substantially 90° (noting that the waveform peaks are offset by ¼ of the wavelength). As can be seen in FIGS. 4 and 5A-5H, the AC signals 134, 136 may cause the rotatable permanent magnet 120 to rotate and, thereby, cause a localized neck to form in the MSM element 110 and to move from one end of the MSM element 110 to the other (e.g., from the first end 116 to the second end 118 or from the second end 118 to the first end 116 depending on a direction of the phase difference between the AC signals 134, 136). For reference purposes, a positive normalized magnetic field is referred to as North magnetization (denoted by the letter 'N') and a negative normalized magnetic field is referred to as South magnetization (denoted by the letter 'S').

Referring to FIG. 5A, a polarization of the solenoids 124, 128 and an orientation of the rotatable permanent magnet 120 are depicted for the time labeled A in FIG. 4. At the time labeled A, the first normalized magnetic field 402 may have an approximate value of √2/2 (0.707) which may result in the first solenoid 124 generating a North magnetic pole facing the rotatable permanent magnetic 120. The second normalized magnetic field 404 may have an approximate value of -√2/2 (-0.707) which may result in the second solenoid 128 generating a South magnetic pole facing the rotatable permanent magnet 120. The combination of the magnetic fields generated by the solenoids 124, 128 may cause the rotatable permanent magnet 120 to assume an orientation with a South magnetic pole facing left and a North magnetic pole facing right. This may result in a predominant direction of a magnetic field exhibited by the rotatable permanent magnet 120 being horizontal to the MSM element 110. Because the MSM element 110 contracts at locations that are subjected to perpendicular magnetic field components, no neck may be formed in the MSM element 110 while in this state.

Referring to FIG. 5B a polarization of the solenoids 124, 128 and an orientation of the rotatable permanent magnet 120 are depicted for the time labeled B in FIG. 4. At the time labeled B, the first normalized magnetic field 402 may have an approximate value of 1.0 which may result in the first solenoid 124 generating a North magnetic pole facing the rotatable permanent magnetic 120. The second normalized magnetic field 244 may have an approximate value of 0.0 which may result in the second solenoid 128 generating no magnetic field. The combination of the magnetic fields generated by the solenoids 124, 128 may cause the rotatable permanent magnet 120 to assume an orientation with a South magnetic pole facing downward and left and a North magnetic pole facing upward and right. This may result in a predominant direction of a magnetic field exhibited by the rotatable permanent magnet 120 being directed toward the second end of the MSM element 110. Thus, at that location, there may be sufficient perpendicular magnetic field components to cause a neck 304 to form along the MSM element 110 at the first end 116.

Figure 5C:
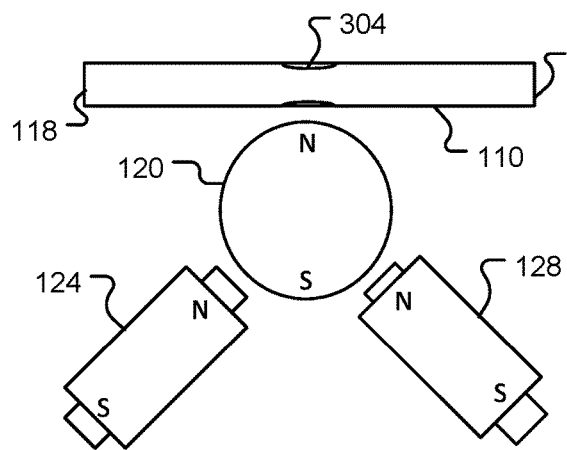

Referring to FIG. 5C a polarization of the solenoids 124, 128 and an orientation of the rotatable permanent magnet 120 are depicted for the time labeled C in FIG. 4. At the time labeled C, the first normalized magnetic field 402 may have an approximate value of $\sqrt{2}/2$ (0.707) which may result in the first solenoid 124 generating a North magnetic pole facing the rotatable permanent magnetic 120. The second normalized magnetic field 404 may also have an approximate value of $\sqrt{2}/2$ (0.707) which may result in the second solenoid 128 generating a North magnetic pole facing the rotatable permanent magnetic 120. The combination of the magnetic fields generated by the solenoids 124, 128 may cause the rotatable permanent magnet 120 to assume an orientation with a South magnetic pole facing downward and a North magnetic pole facing upward. Because the rotation of the rotatable permanent magnet 120 is continuous, the neck 304 may continuously move along the MSM element 110 to the center of the MSM element 110 at time C.

Figure 5D:
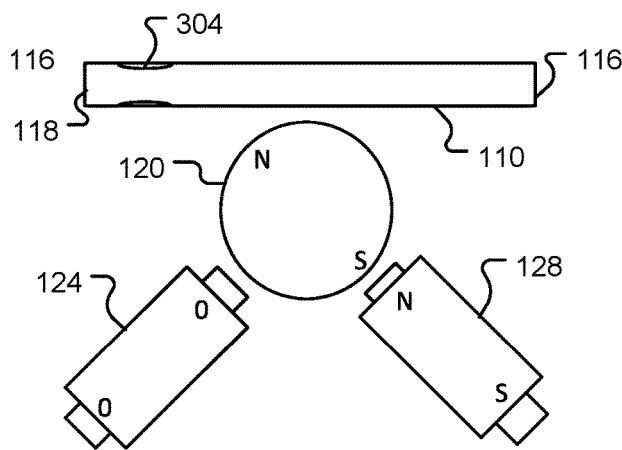

Referring to FIG. 5D, a polarization of the solenoids 124, 128 and an orientation of the rotatable permanent magnet 120 are depicted for the time labeled D in FIG. 4. At the time labeled D, the first normalized magnetic field 402 may have an approximate value of 0.0 which may result in the first solenoid 124 generating no magnetic field. The second normalized magnetic field 404 may have an approximate value of 1.0, which may result in the second solenoid 128 generating a North magnetic pole facing the rotatable permanent magnetic 120. The combination of the magnetic fields generated by the solenoids 124, 128 may cause the rotatable permanent magnet 120 to assume an orientation with a South magnetic pole facing downward and to the right and a North magnetic pole facing upward and to the left. Thus, the neck 304 may be continuously moved to the second end 118 of the MSM element 110 at time D.

Figure 5E:
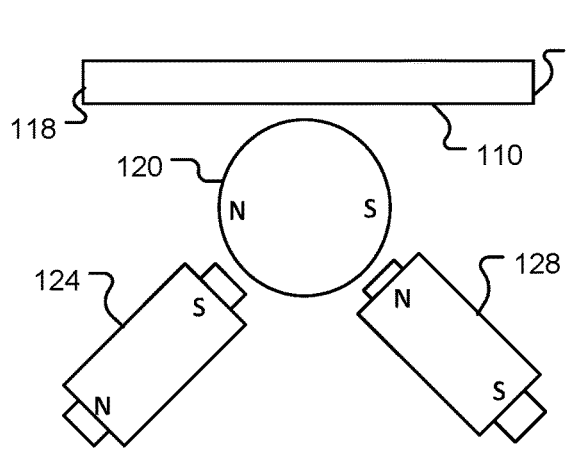

Referring to FIG. 5E, a polarization of the solenoids 124, 128 and an orientation of the rotatable permanent magnet 120 are depicted for the time labeled E in FIG. 4. At the time labeled E, the first normalized magnetic field 402 may have an approximate value of $-\sqrt{2}/2$ (−0.707), which may result in the first solenoid 124 generating a South magnetic pole facing the rotatable permanent magnetic 120. The second normalized magnetic field 404 may have an approximate value of $\sqrt{2}/2$ (0.707), which may result in the second solenoid 128 generating a North magnetic pole facing the rotatable permanent magnetic 120. The combination of the magnetic fields generated by the solenoids 124, 128 may cause the rotatable permanent magnet 120 to assume an orientation with a North magnetic pole facing left and a South magnetic pole facing right. This may result in a predominant direction of a magnetic field exhibited by the rotatable permanent magnet 120 being horizontal to the MSM element 110. Because the MSM element 110 contracts at locations that are subjected to perpendicular magnetic field components, no neck may be formed in the MSM element 110 while in this state.

Figure 5F:
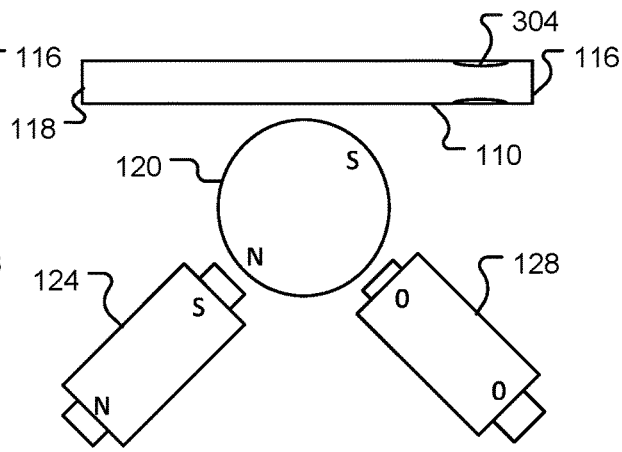

The cycle may then continue in FIGS. 5F, 5G, and 5H with the neck 304 continuously moving from the first end 116 of the MSM element 110 to the second end 118. A difference between FIGS. 5A-5D and FIGS. 5E-5H is that the polarity of the magnetic field from the rotating permanent magnet 120 may be reversed in FIGS. 5A-5D as compared to FIGS. 5E-5H. However, the neck 340 may still form in the MSM element 110 because it is formed based on the perpendicularity of a magnetic field rather than the polarity.

Figure 6:
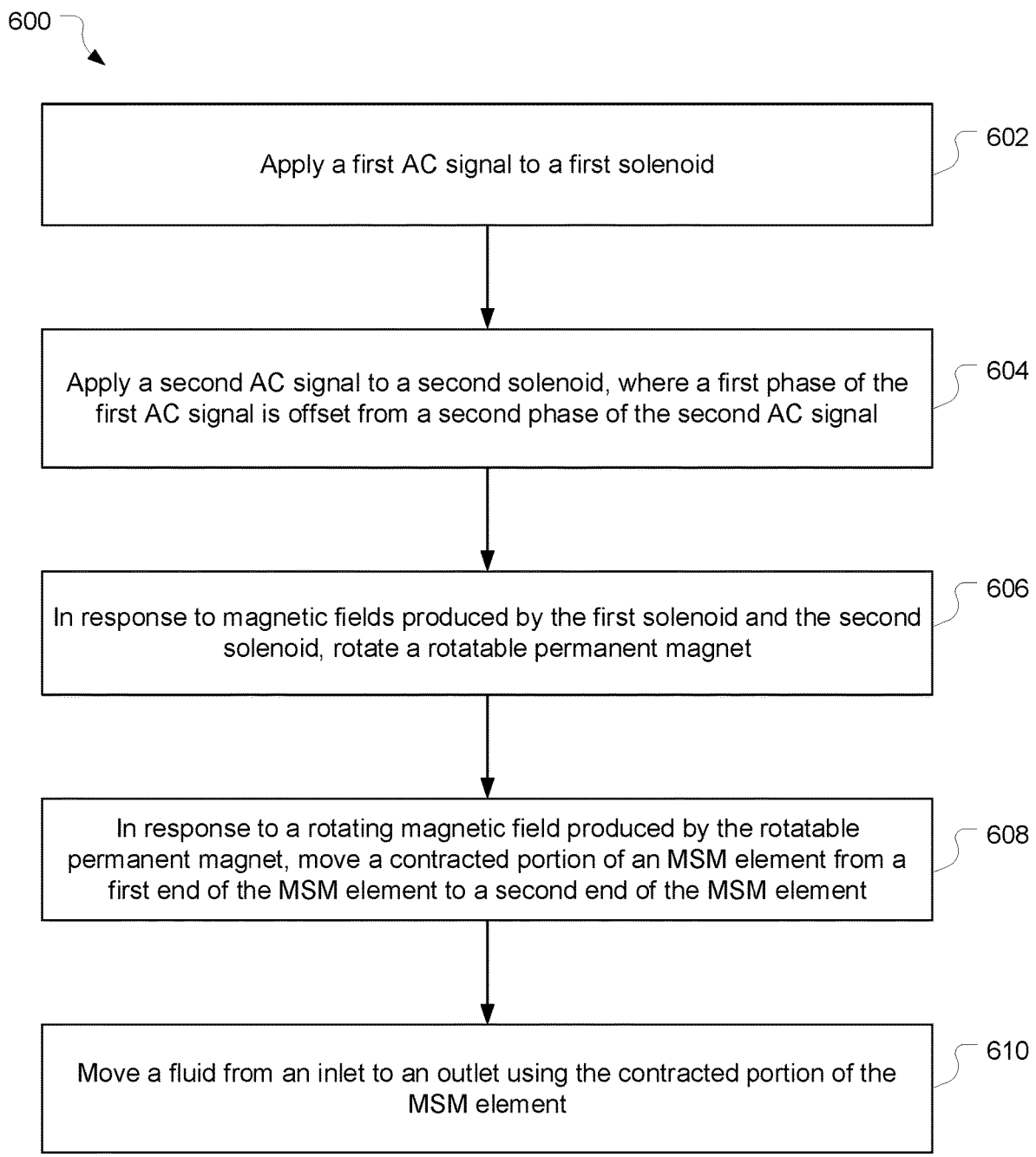
FIG. 6 flow diagram of an embodiment of an MSM actuation method.

Referring to FIG. 6, an embodiment of an MSM actuation method 600 is depicted. The method 600 may include applying a first AC signal to a first solenoid, at 602. For example, the first AC signal 134 may be applied to the first solenoid 124.

The method 600 may further include applying a second AC signal to a second solenoid, where a first phase of the first AC signal is offset from a second phase of the second AC signal, at 604. For example, the second AC signal 136 may be applied to the second solenoid 128.

The method 600 may also include, in response to magnetic fields produced by the first solenoid and the second solenoid, rotating a rotatable permanent magnet, at 606. For example, the rotatable permanent magnet 120 may rotate in response to magnetic fields produced by the solenoids 124, 128.

The method 600 may include, in response to a rotating magnetic field produced by the rotatable permanent magnet, moving a contracted portion of an MSM element from a first end of the MSM element to a second end of the MSM element, at 608. For example, the contracted portion (or neck 304) of the MSM element 110 may move from the first end 116 to the second end 118.

The method 600 may further include moving a fluid from an inlet to an outlet using the contracted portion of the MSM element, at 610. For example, a fluid may be moved from the port 204 to the port 206.

A benefit of the method 600 is that MSM actuation may be performed using lower electrical current as compared to MSM actuation methods that rely solely on electrical coils or solenoids to contract the MSM element while also avoiding external motor equipment for driving a rotatable permanent magnet. Other benefits may exist.

Although various embodiments have been shown and described, the present disclosure is not so limited and will be understood to include all such modifications and variations as would be apparent to one skilled in the art.

What is claimed is:

1. A system comprising:
    a magnetic shape memory (MSM) element having a longitudinal axis that extends from a first end of the MSM element to a second end of the MSM element;
    a rotatable permanent magnet configured to rotate around an axis of rotation and positioned proximate to the MSM element;
    a first solenoid having a first solenoid axis directed at the rotatable permanent magnet; and
    a second solenoid having a second solenoid axis directed at the rotatable permanent magnet.

2. The system of claim 1, further comprising:
    a pump housing having an inlet and an outlet formed within an inner surface of the pump housing, wherein the MSM element is positioned adjacent to the inner surface of the pump housing and extends from the inlet to the outlet.

3. The system of claim 1, wherein a rotating magnetic field produced by the rotatable permanent magnet causes a contracted portion of an MSM element to move from the first end of the MSM element to the second end of the MSM element.

4. The system of claim 1, wherein magnetic fields produced by the first solenoid and the second solenoid cause the rotatable permanent magnet to rotate.

5. The system of claim 1, wherein the first solenoid axis and the second solenoid axis intersect at an angle of substantially 90°.

6. The system of claim 1, further comprising:
a controller configured to apply a first alternating current (AC) signal to the first solenoid and a second AC signal to the second solenoid, wherein the first AC signal and the second AC signal have a substantially 90° phase difference.

7. The system of claim 6, wherein the controller is further configured to shift a phase of the first AC signal by substantially 90° to form the second AC signal.

8. The system of claim 1, further comprising:
a first fixed magnet positioned at the first end of the MSM element; and
a second fixed magnet positioned at the second end of the MSM element.

9. The system of claim 1, further comprising:
a magnetic yoke configured to at least partially direct a magnetic field along a magnetic circuit path from the MSM element to the rotating permanent magnet.

10. The system of claim 1, further comprising;
a first magnetic core positioned within the first solenoid; and
a second magnetic core positioned within the second solenoid.

11. The system of claim 1, further comprising:
one or more additional solenoids having one or more respective solenoid axes directed at the rotatable permanent magnet.

12. The system of claim 1, wherein the rotatable permanent magnet is diametrically magnetized.

13. A method comprising:
applying a first alternating current (AC) signal to a first solenoid;
applying a second AC signal to a second solenoid, wherein a first phase of the first AC signal is offset from a second phase of the second AC signal;
in response to magnetic fields produced by the first solenoid and the second solenoid, rotating a rotatable permanent magnet; and
in response to a rotating magnetic field produced by the rotatable permanent magnet, moving a contracted portion of an MSM element from a first end of the MSM element to a second end of the MSM element.

14. The method of claim 13, wherein the MSM element is positioned adjacent to an inner surface of a pump housing and extends from an inlet formed within the inner surface of the pump housing to an outlet formed within the inner surface of the pump housing.

15. The method of claim 14, further comprising:
moving a fluid from the inlet to the outlet using the contracted portion of the MSM element.

16. The method of claim 13, wherein the first solenoid has a first solenoid axis and the second solenoid has a second solenoid axis, and wherein the first solenoid axis and the second solenoid axis intersect at an angle of substantially 90°.

17. The method of claim 13, wherein the first AC signal and the second AC signal have a substantially 90° phase difference.

18. The method of claim 13, further comprising:
shifting a phase of the first AC signal by substantially 90° to form the second AC signal.

19. The method of claim 13, further comprising:
applying one or more additional AC signals to one or more additional solenoids.

20. The method of claim 13, further comprising:
using a magnetic yoke to direct a magnetic field along a magnetic circuit path from the MSM element to the rotating permanent magnet.

* * * * *